(12) United States Patent
Nishihara et al.

(10) Patent No.: US 10,697,898 B2
(45) Date of Patent: Jun. 30, 2020

(54) SIC SUBSTRATE EVALUATION METHOD AND METHOD FOR MANUFACTURING SIC EPITAXIAL WAFER

(71) Applicant: SHOWA DENKO K.K., Tokyo (JP)

(72) Inventors: Yoshitaka Nishihara, Chichibu (JP); Koji Kamei, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 16/598,486

(22) Filed: Oct. 10, 2019

(65) Prior Publication Data

US 2020/0116649 A1  Apr. 16, 2020

(30) Foreign Application Priority Data

Oct. 15, 2018  (JP) .................. 2018-194020

(51) Int. Cl.
*G01N 21/88* (2006.01)
*H01L 29/16* (2006.01)

(52) U.S. Cl.
CPC . *G01N 21/8806* (2013.01); *G01N 2021/8845* (2013.01); *H01L 29/1608* (2013.01)

(58) Field of Classification Search
CPC .......... G01N 21/9501; G01N 21/6489; G01N 2021/8461; G01N 2021/8477; G01N 21/9505; G01N 21/95607; G01N 27/00; G01B 11/02; G01B 11/0625; G01B 9/02084; H01L 29/1608; H01L 21/02529; H01L 21/02378
See application file for complete search history.

(56) References Cited

U.S. PATENT DOCUMENTS

| 2006/0008941 | A1  | 1/2006  | Haskell et al. |
| 2006/0128124 | A1  | 6/2006  | Haskell et al. |
| 2009/0114148 | A1  | 5/2009  | Stahlbush et al. |
| 2013/0320357 | A1  | 12/2013 | Aigo et al. |
| 2014/0175461 | A1  | 6/2014  | Momose et al. |
| 2014/0190399 | A1  | 7/2014  | Myers-Ward et al. |
| 2015/0168311 | A1* | 6/2015  | Seki ................... G01N 21/9501 356/51 |
| 2019/0172758 | A1* | 6/2019  | Nishihara .......... G01N 21/9501 |
| 2019/0244814 | A1  | 8/2019  | Saito et al. |

(Continued)

FOREIGN PATENT DOCUMENTS

| DE | 11 2015 006 023 T5 | 10/2017 |
| DE | 11 2015 006 024 T5 | 10/2017 |
| DE | 11 2016 001 052 T5 | 11/2017 |

(Continued)

OTHER PUBLICATIONS

JPO Office Action for Application No. 2018-194020 dated May 28, 2019.

(Continued)

*Primary Examiner* — Michael P Stafira
(74) *Attorney, Agent, or Firm* — Sughrue Mion, PLLC

(57) ABSTRACT

In a SiC substrate evaluation method, a bar-shaped stacking fault is observed by irradiating a surface of a SiC substrate before stacking an epitaxial layer with excitation light and extracting light having a wavelength range from equal to or greater than 405 nm and equal to or less than 445 nm among photoluminescence light beams emitted from the first surface.

4 Claims, 2 Drawing Sheets

(56) References Cited

U.S. PATENT DOCUMENTS

2019/0331603 A1* 10/2019 Kamei .................... C30B 29/36

FOREIGN PATENT DOCUMENTS

| | | |
|---|---|---|
| DE | 11 2016 002 106 T5 | 3/2018 |
| DE | 11 2016 005 373 T5 | 8/2018 |
| DE | 11 2017 004 347 T5 | 5/2019 |
| DE | 11 2017 005 034 T5 | 6/2019 |
| DE | 11 2017 006 630 T5 | 9/2019 |
| JP | 2012-160655 A | 8/2012 |
| JP | 2015-129087 A | 7/2015 |
| JP | 2016-025241 A | 2/2016 |
| JP | 2017-224695 A | 12/2017 |
| JP | 2018-014377 A | 1/2018 |
| TW | I445054 B | 7/2014 |
| WO | 2016/121628 A1 | 8/2016 |
| WO | 2018/131449 A1 | 7/2018 |
| WO | 2018/216407 A1 | 11/2018 |

OTHER PUBLICATIONS

Communication dated Jan. 14, 2020, issued by the Korean Intellectual Property Office in application No. 10-2019-0125982.
Office Action dated Mar. 13, 2020 in German Application No. 102019127412.5.
Communication dated Apr. 14, 2020, from the Taiwanese Intellectual Property Office in Application No. 108136891.

* cited by examiner

SIC SUBSTRATE EVALUATION METHOD AND METHOD FOR MANUFACTURING SIC EPITAXIAL WAFER

BACKGROUND OF THE INVENTION

Field of the Invention

The present invention relates to a SiC substrate evaluation method and a method for manufacturing a SiC epitaxial wafer.

Priority is claimed on Japanese Patent Application No. 2018-194020, filed on Oct. 15, 2018, the content of which is incorporated herein by reference.

Description of Related Art

Silicon carbide (SiC) has a dielectric breakdown electric field one order of magnitude larger and a band gap three times larger than silicon (Si). In addition, silicon carbide (SiC) has a characteristic such as a thermal conductivity being approximately three times higher than silicon (Si). Silicon carbide (SiC) is expected to be applied to power devices, high frequency devices, high temperature operation devices and the like.

Devices such as semiconductors using SiC (hereinafter referred to as SiC devices) are formed on SiC epitaxial wafers in which epitaxial layers are formed on SiC substrates. Hereinafter, a wafer before forming an epitaxial layer will be referred to as a SiC substrate, and a wafer after forming an epitaxial layer will be referred to as a SiC epitaxial wafer.

A SiC substrate is obtained by slicing a SiC ingot. A SiC epitaxial wafer includes a SiC substrate and an epitaxial layer. The epitaxial layer is stacked on one surface of the SiC substrate by chemical vapor deposition (CVD) or the like. The epitaxial layer becomes an active region of a SiC device.

Si substrates widely used in semiconductor devices can be manufactured with high quality and do not require epitaxial layers. On the other hand, SiC substrates have a larger number of defects than the Si substrates. The epitaxial layer is formed to improve the quality of a SiC device.

Japanese Unexamined Patent Application, First Publication No. 2016-25241 discloses that the surface of a SiC epitaxial wafer after forming an epitaxial layer is evaluated by a photoluminescence method.

SUMMARY OF THE INVENTION

SiC devices may have degraded characteristics (bipolar degradation may occur) when a voltage is applied in a forward direction. A single Shockley-type stacking fault is said to be one of the causes of the bipolar degradation. The single Shockley-type stacking fault is formed due to expansion of a basal plane dislocation when a voltage is applied in a forward direction of a SiC device including the basal plane dislocation in an active region. There is a concern that this bipolar degradation may not be found in the initial characterization and may be leaked. For this reason, bipolar degradation is a major problem to be solved.

Both a chemical etching method and a photoluminescence method are representative methods for identifying a defect causative of bipolar degradation. In the chemical etching method, the surface of a SiC crystal is chemically etched with alkali. The chemical etching method is a destructive inspection, and a used substrate cannot be used for the manufacture of a device.

The photoluminescence method is a method of irradiating the surface of a substrate with excitation light and observing obtained photoluminescence light. The photoluminescence method is a non-destructive method, and a used substrate can be used for the manufacture of a device.

On the other hand, it is said that the photoluminescence method is useful to evaluate a SiC epitaxial wafer after stacking an epitaxial layer, but is difficult to evaluate a SiC substrate before stacking an epitaxial layer. This is because the SiC substrate has a large number of impurity levels as compared with the epitaxial layer. An impurity concentration of the epitaxial layer is, for example, approximately $1 \times 10^{15}$ atom/cm$^3$ to approximately $1 \times 10^{16}$ atom/cm$^3$, while an impurity concentration of the SiC substrate is, for example, approximately $1 \times 10^{18}$ atom/cm$^3$. When the impurity concentration is high, the obtained photoluminescence spectrum becomes broad, and it becomes difficult to identify a specific defect.

Among the defects that cause bipolar degradation, there are defects in which the defects of the SiC substrate are taken over by the epitaxial layer. If defects can be specified at the time of the SiC substrate, the production yield of high-quality SiC epitaxial wafers can be increased. There is a need for a method capable of non-destructively distinguishing specific defects.

The present invention is contrived in view of the above-described problem, and an object thereof is to provide a SiC substrate evaluation method for identifying a bar-shaped stacking fault at the time of SiC substrate before stacking an epitaxial layer thereon.

A basal plane dislocation and the like are known as defects causative of bipolar degradation. Basal plane dislocations are decreasing with the progress of crystal growth techniques. With the decrease in basal plane dislocations, investigations have been made to identify and suppress other defects. Based on such investigations, the inventor has given attention to a bar-shaped stacking fault as a new defect and has found a method for identifying a bar-shaped stacking fault at the time of a SiC substrate, that is, at the time of a SiC substrate before stacking an epitaxial layer thereon.

That is, the present invention provides the following means in order to solve the above-described problem.

A SiC substrate evaluation method according to a first aspect includes observing a bar-shaped stacking fault by irradiating a first surface of a SiC substrate before stacking an epitaxial layer with excitation light and extracting light having a wavelength range of equal to or greater than 405 nm and equal to or less than 445 nm among photoluminescence light beams emitted from the first surface, wherein the first surface of the SiC substrate has an offset angle from a {0001} plane, an irradiation time of the excitation light is equal to or greater than 1 msec and equal to or less than 10 sec, and an intensity of the excitation light is equal to or less than 1 W/cm$^2$, and wherein the bar-shaped stacking fault extends in a bar shape in a direction substantially perpendicular to the offset direction, the bar-shaped stacking fault has a length in a direction substantially perpendicular to the offset direction with respect to a width in the offset direction is long and the bar-shaped stacking fault has an aspect ratio (length/width) is equal to or greater than 2, and wherein the offset direction is the direction of a vector obtained by projecting a normal vector of a {0001} plane onto the first surface of the SiC substrate.

In the SiC substrate evaluation method according to the aspect, a wavelength of the excitation light may be equal to or greater than 200 nm and equal to or less than 390 nm.

In the SiC substrate evaluation method according to the aspect, the bar-shaped stacking fault may be a single Shockley-type stacking fault extending in a bar shape in a direction substantially perpendicular to an offset direction.

A method for manufacturing a SiC substrate according to a second aspect includes an evaluation step of evaluating the first surface of the SiC substrate using the SiC substrate evaluation method according to the aspect; a determination step of determining whether to stack an epitaxial layer on the basis of results of the evaluation step; and a stacking step of stacking an epitaxial layer on the first surface on the basis of results of the determination step.

A SiC substrate evaluation method according to a third aspect includes observing a bar-shaped stacking fault by irradiating a first surface of a SiC substrate before stacking an epitaxial layer with excitation light and extracting light having a wavelength range of equal to or greater than 405 nm and equal to or less than 445 nm in photoluminescence light beams emitted from the first surface.

The SiC substrate evaluation method according to the aspect preferably includes the following features. It is also preferable to combine one or more of the following features.

In the SiC substrate evaluation method according to the aspect, a wavelength of the excitation light may be equal to or greater than 200 nm and equal to or less than 390 nm.

In the SiC substrate evaluation method according to the aspect, the bar-shaped stacking fault may be a single Shockley-type stacking fault extending in a bar shape in a direction substantially perpendicular to an offset direction.

In the SiC substrate evaluation method according to the aspect, an irradiation time of the excitation light may be equal to or greater than 1 msec and equal to or less than 10 sec.

In the SiC substrate evaluation method according to the aspect, an intensity of the excitation light may be equal to or less than 1 W/cm$^2$.

A method for manufacturing a SiC substrate according to a fourth aspect includes an evaluation step of evaluating a first surface of the SiC substrate using the SiC substrate evaluation method according to the above-described aspect, a determination step of determining whether to stack an epitaxial layer on the basis of results of the evaluation step, and a growing step of growing an epitaxial layer on the first surface on the basis of results of the determination step.

A SiC epitaxial wafer according to a fifth aspect includes a SiC substrate and an epitaxial layer stacked on a first surface of the SiC substrate, in which an area occupied by bar-shaped stacking faults in the epitaxial layer is equal to or less than ¼ of an area of the epitaxial layer.

In the SiC epitaxial wafer according to the aspect, a density of the bar-shaped stacking faults may be equal to or less than 10 pieces/cm$^2$.

According to the SiC substrate evaluation method of the above-described aspects, it is possible to identify a bar-shaped stacking fault at the time of a SiC substrate before stacking an epitaxial layer thereon. In addition, it is possible to manufacture a SiC epitaxial wafer having a small number of bar-shaped stacking faults by using the SiC substrate evaluation method.

DETAILED DESCRIPTION OF THE INVENTION

Figure 1:
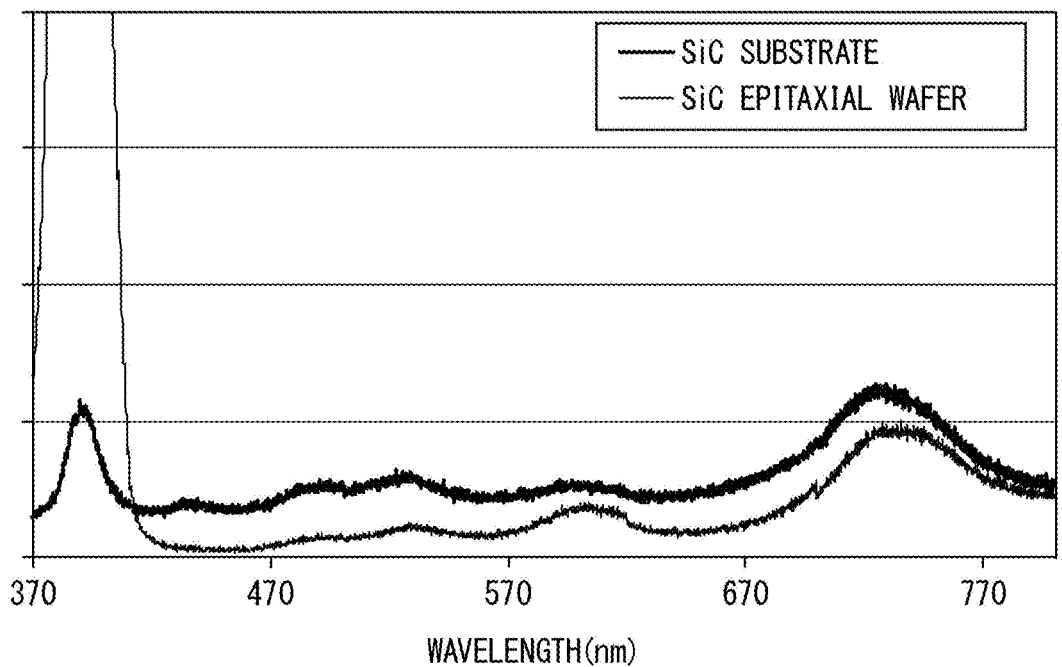
FIG. 1 is a graph showing comparison between a photoluminescence spectrum of a SiC substrate before stacking an epitaxial layer and a photoluminescence spectrum of a SiC epitaxial wafer after stacking the epitaxial layer.

Hereinafter, preferred examples of the present embodiment will be described in detail with reference to the accompanying drawings as appropriate. In some cases, in the drawings used in the following description, characteristic portions are illustrated at an enlarged scale for convenience of easy understanding of characteristics, and the dimensional ratios and the like of the respective components are not necessarily the same as the actual ones. In the following description, materials, dimensions, and the like are merely exemplary, do not limit the present invention, and can be appropriately modified within a range in which the effects of the present invention are exhibited. The numbers, sizes, positions, materials, ratios, shapes and the like may be changed, added to or omitted as necessary as long as there are no particular limitations.

"Method for Manufacturing SiC Substrate"

A method for manufacturing a SiC substrate according to the present embodiment includes a SiC ingot manufacturing step, a SiC substrate manufacturing step, a SiC substrate evaluation step, a SiC substrate determination step, and an epitaxial layer growing step.

A SiC ingot is a bulk single crystal of SiC. The SiC ingot can be manufactured by a sublimation recrystallization method or the like.

A SiC substrate is manufactured from the manufactured SiC ingot. The SiC substrate is obtained by slicing the SiC ingot. It is preferable that the surface of the SiC substrate be ground.

Subsequently, a first surface of the SiC substrate is evaluated. The first surface is a surface on which an epitaxial layer will be grown in a step to be described later. The first surface is evaluated by a photoluminescence method.

The photoluminescence method is a method of irradiating a material with excitation light and measuring light emitted when excited electrons return to a ground state. The first surface of the SiC substrate is irradiated with excitation light having an energy larger than that of a band gap of SiC, and the intensity of photoluminescence emitted from the SiC substrate is measured. A defect of the SiC substrate, a location where impurities aggregate, and the like are identified by applying a photoluminescence method to the SiC substrate.

FIG. 1 is a graph showing comparison between a photoluminescence spectrum of a SiC substrate before stacking an epitaxial layer and a photoluminescence spectrum of a SiC epitaxial wafer after stacking the epitaxial layer. In the graph, both the photoluminescence spectrums have a light emission peak in the vicinity of 390 nm. This light emission peak is derived from band edge emission of 4H-SiC. In the SiC epitaxial wafer, a light emission intensity of a light emission peak in the vicinity of 390 nm is significantly larger than light emission intensities in the other wavelength ranges. In the SiC substrate, light emission intensities in the other wavelength ranges are also larger than a light emission intensity of a light emission peak in the vicinity of 390 nm. This is because the SiC substrate has a larger number of impurity levels than the epitaxial layer.

In the photoluminescence method, defects are distinguished from each other using a difference in a light emission intensity of photoluminescence light which occurs due to a difference between a band gap of a normal crystal portion having no defects and a pseudo band gap having a defect due to the structure of the defect. It becomes more difficult to distinguish between defects as a photoluminescence spectrum becomes broader.

Figure 2A:
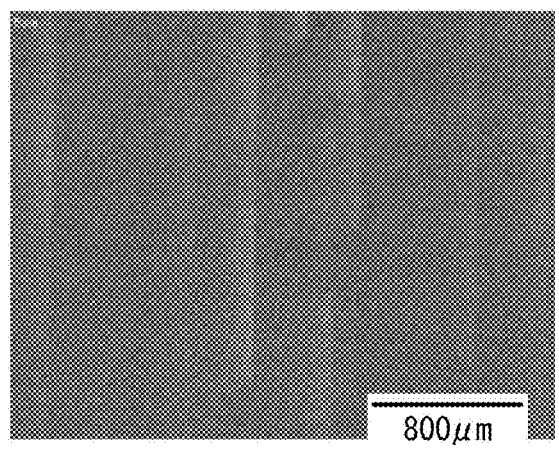
FIGS. 2A and 2B are photoluminescence images of a first surface of a SiC substrate, FIG. 2A showing a case where a bar-shaped stacking fault looks white with respect to a normal crystal portion having no defects, and FIG. 2B showing a case where a bar-shaped stacking fault looks black with respect to a normal crystal portion having no defects under the same measurement conditions as in FIG. 2A.
Figure 2B:
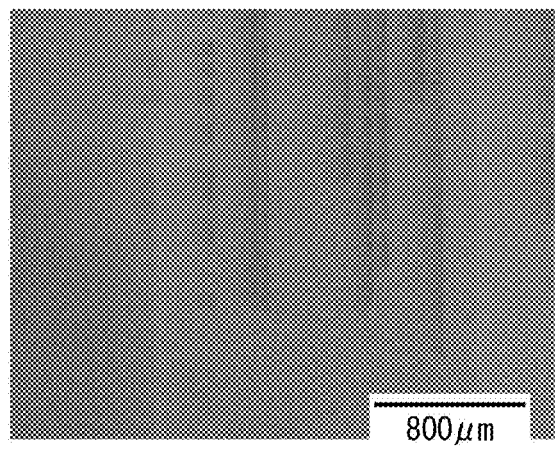

FIGS. 2A and 2B are photoluminescence images of the first surface of the SiC substrate. FIGS. 2A and 2B are images obtained by irradiating the first surface of the SiC substrate with excitation light using a band pass filter passing a wavelength of 313 nm and measuring a photoluminescence image of a bar-shaped stacking fault using a high pass filter passing a near-infrared wavelength (a wavelength of 660 nm or more). FIG. 2A and FIG. 2B are images obtained by measurements performed under the same conditions.

In FIG. 2A, a bar-shaped stacking fault looks white with respect to a normal crystal portion having no defects. On the other hand, in FIG. 2B, a bar-shaped stacking fault looks black with respect to a normal crystal portion having no defects. That is, appearances of the bar-shaped stacking faults are different from each other regardless of measurements performed under the same conditions. In addition, a difference in contrast between the bar-shaped stacking fault and the normal crystal portion having no defects is small, and the bar-shaped stacking fault is observed blurrily, which results in a difficulty in identification. Therefore, there is a concern that the bar-shaped stacking fault may be missed and erroneously classified as a basal plane dislocation.

Figure 3:
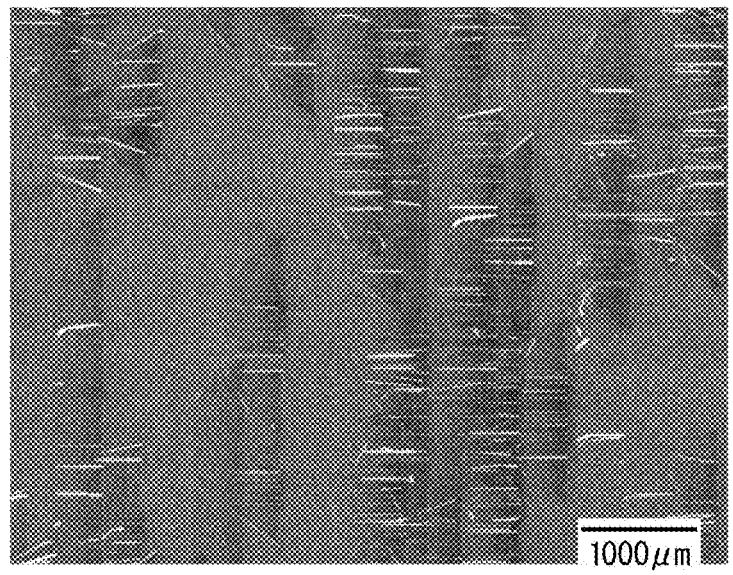
FIG. 3 is an observation diagram of a photoluminescence image of the surface of a SiC epitaxial wafer after stacking an epitaxial layer on a SiC substrate.

Here, a bar-shaped stacking fault will be described. FIG. 3 is a photoluminescence image of the surface of a SiC epitaxial wafer after stacking an epitaxial layer on a SiC substrate. FIG. 3 is an image obtained by irradiating the surface of the SiC epitaxial wafer with excitation light using a band pass filter passing a wavelength of 313 nm and measuring a photoluminescence image of a bar-shaped stacking fault using a high pass filter passing a near-infrared wavelength (a wavelength of 660 nm or more).

The bar-shaped stacking fault is a single Shockley-type stacking fault formed in a bar shape. The single Shockley-type stacking fault is caused by a deviation of the arrangement of atoms by one atom. The bar-shaped stacking fault extends in a bar shape in a direction substantially perpendicular to an offset direction. In the bar-shaped stacking fault, a length in a direction substantially perpendicular to an offset direction with respect to a width in the offset direction is long and an aspect ratio (length/width) is equal to or greater than 2. Since this bar-shaped-like single Shockley-type stacking fault is the same type as a partial dislocation of a basal plane dislocation, it is expected that the stacking fault will expand and bipolar degradation will occur when a current is applied to a bipolar device including the defect in a forward direction for a long period of time. A stacking fault due to a crystal polymorphism such as 6H does not expand, and thus the stacking fault can be found in the initial characterization and excluded.

The offset direction is the direction of a vector obtained by projecting a normal vector of a {0001} plane onto a first surface (crystal growth surface) of a SiC substrate. The offset direction in FIG. 3 is a crosswise direction in which a left side is an offset upstream side and a right side is an offset downstream side. "Offset upstream" refers to a direction in which the tip of the vector obtained by projecting the normal vector of the {0001} plane onto the first surface (crystal growth plane) of the SiC substrate is directed, and "offset downstream" is a direction opposite to the offset upstream. In other words, "offset upstream" refers to an upstream side (starting point side) of step flow growth in the SiC substrate, and "offset downstream" refers to a downstream side of the step flow growth in the SiC substrate.

The bar-shaped stacking fault looks like a trapezoidal shape whose upper base is the offset upstream when the SiC epitaxial wafer after stacking the epitaxial layer on a SiC substrate is seen in a plan view. This is because the bar-shaped stacking fault in the SiC substrate is transferred to the epitaxial layer and expands to the offset downstream side. A white line extending in the offset direction within the bar-shaped stacking fault in FIG. 3 is considered to be a basal plane dislocation. The bar-shaped stacking fault is a stacking fault which is formed in the SiC ingot and included in the SiC substrate which is transferred to the epitaxial layer. The bar-shaped stacking fault is different from a stacking fault caused by a line defect such as a dislocation in a defect image in a photoluminescence image. In the epitaxial layer, the former defect image is trapezoidal, while the latter defect image is triangular because a starting point is a line defect.

As shown in FIGS. 2A and 2B, the bar-shaped stacking fault is difficult to identify in the SiC substrate before stacking the epitaxial layer thereon. In addition, as shown in FIG. 3, in the bar-shaped stacking fault in the SiC epitaxial wafer after stacking the epitaxial layer, unlike a stacking fault caused by a dislocation, the contrast of white lines (basal plane dislocations) within the defect is strong, and thus the accuracy of classification of a stacking fault is lowered.

Consequently, in the SiC substrate evaluation step according to the present embodiment, a bar-shaped stacking fault is observed by irradiating the first surface of the SiC substrate before stacking the epitaxial film with excitation light and extracting light having a wavelength range from equal to or greater than 405 nm to equal to or less than 445 nm among photoluminescence light beams emitted from the first surface.

Figure 4A:
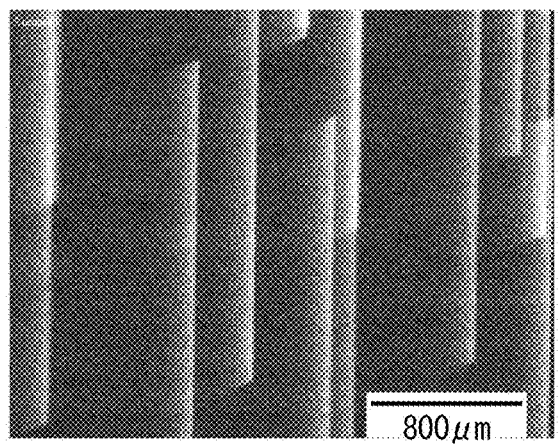
FIGS. 4A and 4B are photoluminescence images of a first surface of a SiC substrate, FIG. 4A showing measurement results obtained at the same position as in FIG. 2A in a case where a wavelength to be observed is near-infrared light, and FIG. 4B showing measurement results obtained at the same position as in FIG. 2B in a case where a wavelength to be observed is light having a wavelength range in the vicinity of 425 nm.
Figure 4B:
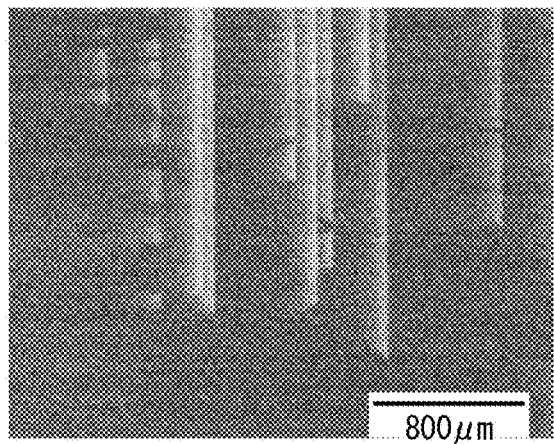

FIGS. 4A and 4B are photoluminescence images of the first surface of the SiC substrate. FIGS. 4A and 4B are images obtained by irradiating the first surface of the SiC substrate with excitation light using a band pass filter passing a wavelength of 313 nm and measuring a photoluminescence image in which light in the vicinity of 425 nm is extracted from photoluminescence light emitted from the first surface. FIG. 4A and FIG. 4B show measurement results obtained at the same positions as in FIG. 2A and FIG. 2B, and FIGS. 4A and 4B are different from FIGS. 2A and 2B in that light having a wavelength to be observed is near-infrared light or light in a wavelength range in the vicinity of 425 nm.

As shown in FIG. 1, in the photoluminescence spectrum of the SiC epitaxial wafer, a wavelength range in the vicinity of 420 nm is a portion corresponding to the foot of a light emission peak in the vicinity of 390 nm. The wavelength range in the vicinity of 420 nm is a wavelength range which is difficult to select also in evaluation of the SiC substrate when conditions of photoluminescence measurement in the SiC epitaxial wafer are followed. On the other hand, in the photoluminescence spectrum of the SiC substrate, a light emission intensity in a background other than 390 nm is high, and an intensity of the light emission peak in the vicinity of 390 nm is relatively reduced. For this reason, in the evaluation of the SiC substrate, a wavelength range in the vicinity of 420 nm can be used.

As shown in FIGS. 4A and 4B, when light in a wavelength range in the vicinity of 425 nm is extracted, a bar-shaped stacking fault looks white with respect to a normal crystal portion having no defects. A S/N of a bar-shaped stacking fault when measured in this wavelength range is equal to or greater than 4.5, and thus it is possible to more clearly identify a bar-shaped stacking fault than in a case of S/N=3.8 when a bar-shaped stacking fault is measured in a near-infrared wavelength range equal to or greater than 660 nm. In addition, even if the measurement conditions of the bar-shaped stacking faults are the same, it does not mean that the bar-shaped stacking faults look different (see FIGS. 2A and 2B).

Therefore, according to the SiC substrate evaluation method of the present embodiment, it is possible to identify a bar-shaped stacking fault which is a killer defect of a device at the time of a SiC substrate before stacking an epitaxial layer thereon.

A method of extracting light having a wavelength range from equal to or greater than 405 nm to equal to or less than 445 nm among photoluminescence light beams emitted from a first surface of a SiC substrate is not be particularly limited, and for example, a band pass filter can be used. A band pass filter having a specific wavelength transmits light having a wavelength range of a specific wavelength of approximately ±20 nm. For example, when a band pass filter having a specific wavelength of 425 nm is used, light having a wavelength band from equal to or greater than 405 nm to equal to or less than 445 nm can be extracted.

For example, a mercury lamp can be used as a light source of excitation light. An irradiation time of excitation light is preferably equal to or greater than 1 msec and equal to or less than 10 sec, and is more preferably equal to or greater than 10 msec and equal to or less than 1 sec. When excitation light is sufficiently emitted, the contrast between BPD and the other regions becomes clear, while "burning" occurs due to the excitation light, which also causes a decrease in detection sensitivity. For this reason, it is preferable to reduce the intensity of excitation light to be emitted. Specifically, the intensity is preferably equal to or less than 1 W/cm$^2$ and is more preferably equal to or less than 500 mW/cm$^2$. A wavelength of excitation light to be emitted is preferably equal to or greater than 200 nm and equal to or less than 390 nm. The intensity of excitation light to be emitted can be reduced by using a mercury lamp.

Subsequently, it is determined whether to stack an epitaxial layer on the first surface of the SiC substrate on the basis of results of the above-described SiC substrate evaluation step (SiC substrate determination step).

For example, in a case where an area occupied by a bar-shaped stacking fault in the SiC substrate is equal to or greater than ¼ of the surface area of the SiC substrate, an epitaxial layer is not stacked. The bar-shaped stacking fault on the first surface of the SiC substrate is transferred to the epitaxial layer and expands. This is because an area occupied by the bar-shaped stacking fault is equal to or greater than ¼ in a SiC epitaxial wafer after stacking an epitaxial layer in a case where the area occupied by the bar-shaped stacking fault is equal to or greater than ¼ of the surface area of the SiC substrate at the time of the SiC substrate.

In addition, for example, the determination may be performed on the basis of the number, density, length and the like of the bar-shaped stacking fault. For example, in a case where equal to or greater than 10 pieces/cm$^2$ of bar-shaped stacking faults are confirmed in the SiC substrate, an epitaxial layer is not stacked. In addition, for example, in a case where a bar-shaped stacking fault of ½ or more of the diameter of the wafer is confirmed in the SiC substrate, an epitaxial layer is not stacked.

The determination step may include a second determination step of determining a film thickness of an epitaxial layer to be stacked, in addition to a first determination step of determining whether to stack an epitaxial layer. As described above, a bar-shaped stacking fault on the first surface of the SiC substrate is transferred to the epitaxial layer and expands. As the film thickness of the epitaxial layer increases, the bar-shaped stacking fault expands more, and the bar-shaped stacking fault confirmed on the surface of the epitaxial layer becomes larger.

A relationship between the degree of expansion of a bar-shaped stacking fault and the thickness of an epitaxial layer may be obtained on the basis of a calibration curve based on actual measurement or may be calculated from an offset angle of a SiC substrate.

Finally, an epitaxial layer is stacked on the first surface on the basis of results of the determination step (SiC substrate stacking step).

By performing the determination step, for example, it is possible to obtain a SiC epitaxial wafer including a SiC substrate and an epitaxial layer stacked on a first surface of the SiC substrate, in which an area occupied by a bar-shaped stacking fault is equal to or less than ¼ of an area of the epitaxial layer. In addition, for example, it is also possible to obtain a SiC epitaxial wafer having no bar-shaped stacking fault.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A SiC substrate evaluation method, comprising:
observing a bar-shaped stacking fault by irradiating a first surface of a SiC substrate before stacking an epitaxial layer with excitation light and extracting light having a wavelength range of equal to or greater than 405 nm and equal to or less than 445 nm among photoluminescence light beams emitted from the first surface,
wherein the first surface of the SiC substrate has an offset angle from a {0001} plane, an irradiation time of the excitation light is equal to or greater than 1 msec and equal to or less than 10 sec, and an intensity of the excitation light is equal to or less than 1 W/cm$^2$, and
wherein the bar-shaped stacking fault extends in a bar shape in a direction substantially perpendicular to the offset direction, the bar-shaped stacking fault has a length in a direction substantially perpendicular to the offset direction with respect to a width in the offset direction is long and the bar-shaped stacking fault has an aspect ratio (length/width) is equal to or greater than 2, and wherein the offset direction is the direction of a vector obtained by projecting a normal vector of a {0001} plane onto the first surface of the SiC substrate.

2. The SiC substrate evaluation method, according to claim 1, wherein a wavelength of the excitation light is equal to or greater than 200 nm and equal to or less than 390 nm.

3. The SiC substrate evaluation method, according to claim 1, wherein the bar-shaped stacking fault is a single Shockley-type stacking fault extending in a bar shape in a direction substantially perpendicular to an offset direction.

4. A method for manufacturing a SiC substrate, comprising:
  an evaluation step of evaluating the first surface of the SiC substrate using the SiC substrate evaluation method according to claim 1;
  a determination step of determining whether to stack an epitaxial layer on the basis of results of the evaluation step; and
  a growing step of growing an epitaxial layer on the first surface on the basis of results of the determination step.

* * * * *